(12) United States Patent
Shelton et al.

(10) Patent No.: US 7,179,670 B2
(45) Date of Patent: Feb. 20, 2007

(54) FLIP-CHIP LIGHT EMITTING DIODE DEVICE WITHOUT SUB-MOUNT

(75) Inventors: Bryan S. Shelton, Bound Brook, NJ (US); Sebastien Libon, Tervuren (BE); Hari S. Venugopalan, Somerset, NJ (US); Ivan Eliashevich, Maplewood, NJ (US); Stanton E. Weaver, Jr., Northville, NY (US); Chen-Lun Hsing Chen, Taipei (TW); Thomas F. Soules, Richmond Heights, OH (US); Steven LeBoeuf, Schenectady, NY (US); Stephen Arthur, Glenville, NY (US)

(73) Assignee: GELcore, LLC, Valley View, OH (US)

( * ) Notice: Subject to any disclaimer, the term of this patent is extended or adjusted under 35 U.S.C. 154(b) by 46 days.

(21) Appl. No.: 10/794,935

(22) Filed: Mar. 5, 2004

(65) Prior Publication Data

US 2005/0194605 A1 Sep. 8, 2005

(51) Int. Cl.
*H01L 21/00* (2006.01)
(52) U.S. Cl. .......................... 438/26; 438/108
(58) Field of Classification Search ................ 438/22, 438/24–27, 29, 108, 118; 257/99
See application file for complete search history.

(56) References Cited

U.S. PATENT DOCUMENTS

| | | | |
|---|---|---|---|
| 5,795,619 A | 8/1998 | Lin et al. | |
| 6,153,503 A | 11/2000 | Lin et al. | |
| 6,222,207 B1 | 4/2001 | Carter-Coman et al. | |
| 6,268,114 B1 | 7/2001 | Wen et al. | |
| 6,307,218 B1 | 10/2001 | Steigerwald et al. | |
| 6,326,701 B1 * | 12/2001 | Shinogi et al. | 257/797 |
| 6,440,836 B1 | 8/2002 | Lu et al. | |
| 6,514,782 B1 | 2/2003 | Wierer, Jr. et al. | |
| 6,521,914 B2 * | 2/2003 | Krames et al. | 257/81 |
| 6,547,249 B2 | 4/2003 | Collins, III et al. | |
| 6,573,537 B1 | 6/2003 | Steigerwald et al. | |
| 6,656,828 B1 | 12/2003 | Maitani et al. | |
| 6,661,029 B1 | 12/2003 | Duggal | |
| 6,924,437 B1 * | 8/2005 | Creekmore et al. | 174/138 G |
| 6,969,626 B2 | 11/2005 | Guo et al. | |
| 7,026,181 B2 | 4/2006 | Guo et al. | |
| 2001/0004534 A1 | 6/2001 | Carter-coman et al. | |
| 2002/0179901 A1 * | 12/2002 | Arai et al. | 257/40 |
| 2003/0151148 A1 * | 8/2003 | Camenforte et al. | 257/780 |
| 2003/0190770 A1 | 10/2003 | Yeom et al. | |

* cited by examiner

*Primary Examiner*—Sara Crane
(74) *Attorney, Agent, or Firm*—Fay Sharpe LLP

(57) ABSTRACT

A light emitting diode (10) has a backside and a front-side with at least one n-type electrode (14) and at least one p-type electrode (12) disposed thereon defining a minimum electrodes separation ($d_{electrodes}$). A bonding pad layer (50) includes at least one n-type bonding pad (64) and at least one p-type bonding pad (62) defining a minimum bonding pads separation ($d_{pads}$) that is larger than the minimum electrodes separation ($d_{electrodes}$). At least one fanning layer (30) interposed between the front-side of the light emitting diode (10) and the bonding pad layer (50) includes a plurality of electrically conductive paths passing through vias (34, 54) of a dielectric layer (32, 52) to provide electrical communication between the at least one n-type electrode (14) and the at least one n-type bonding pad (64) and between the at least one p-type electrode (12) and the at least one p-type bonding pad (62).

32 Claims, 14 Drawing Sheets

Section B-B

Section A-A

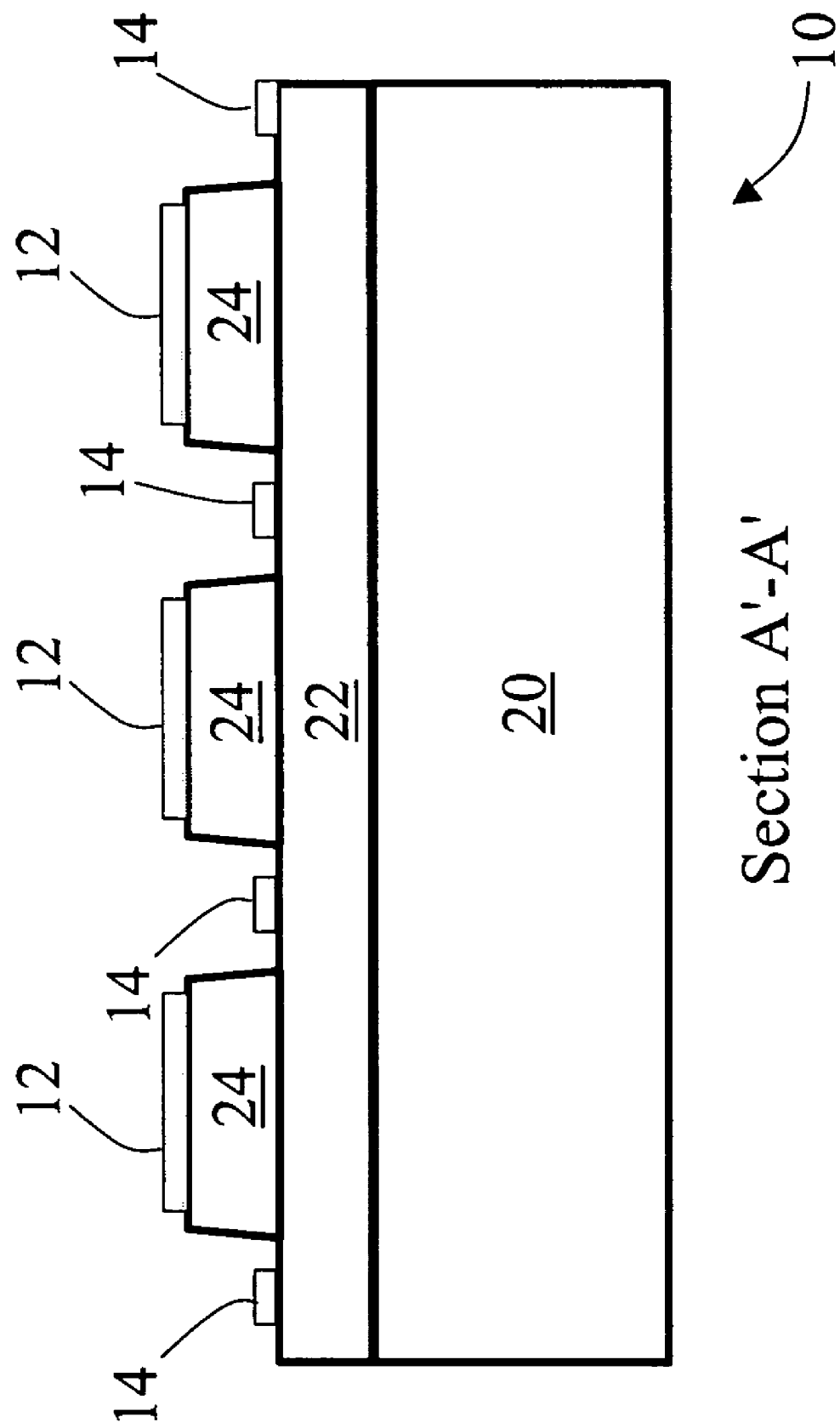

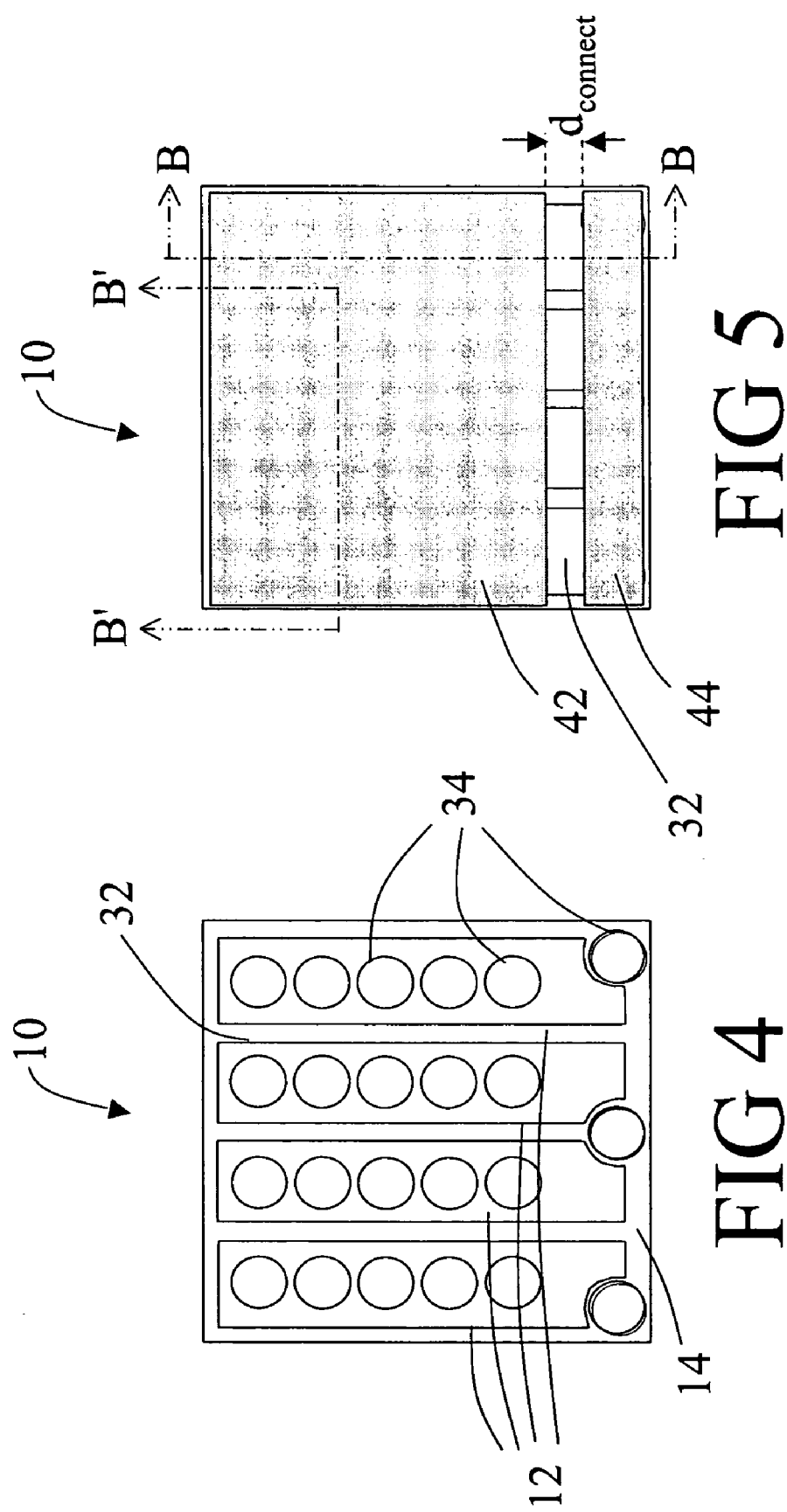

Section B-B

Section B'-B'

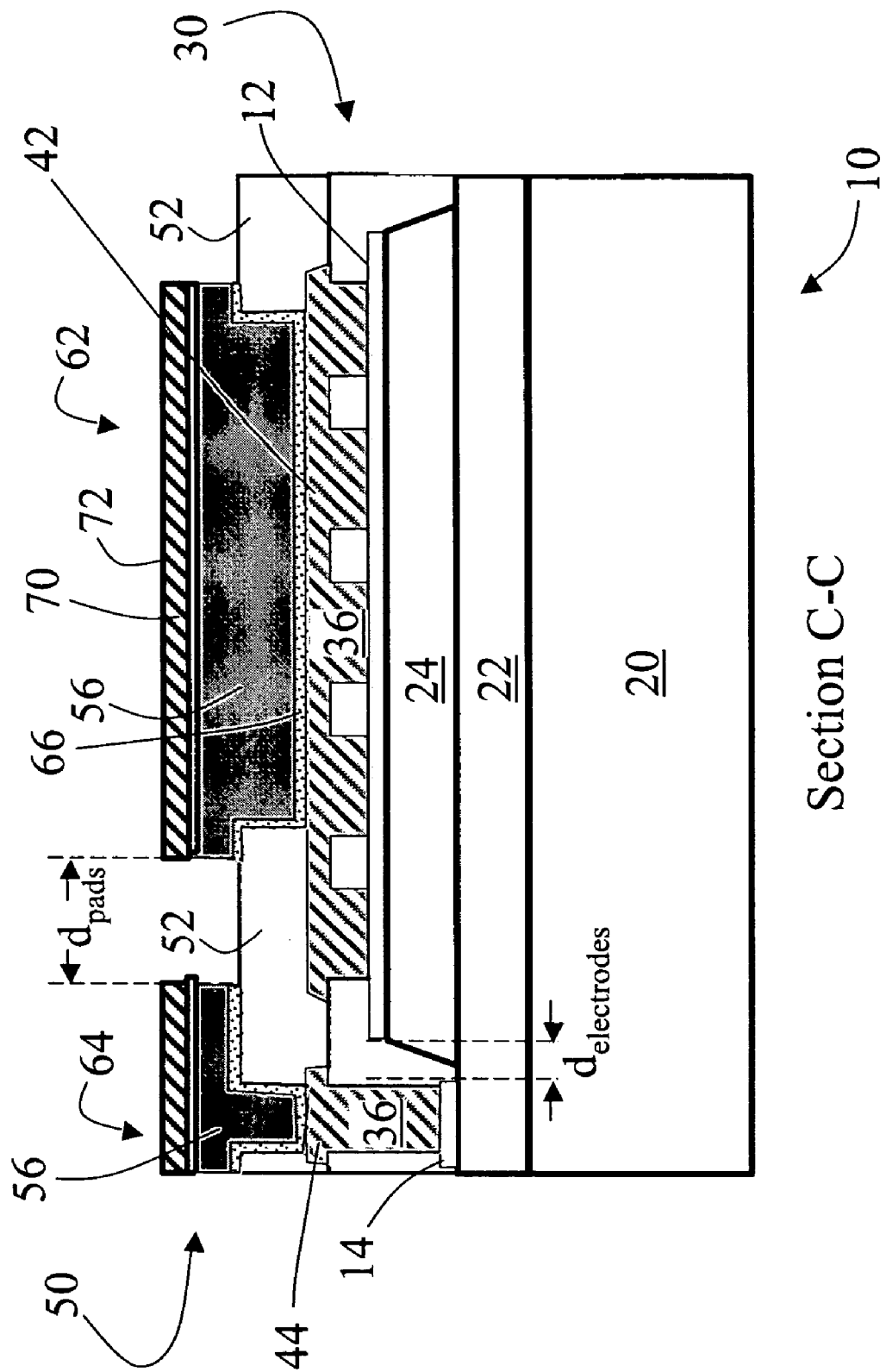
Section C-C    FIG 10

Section C'-C'

Section C-C

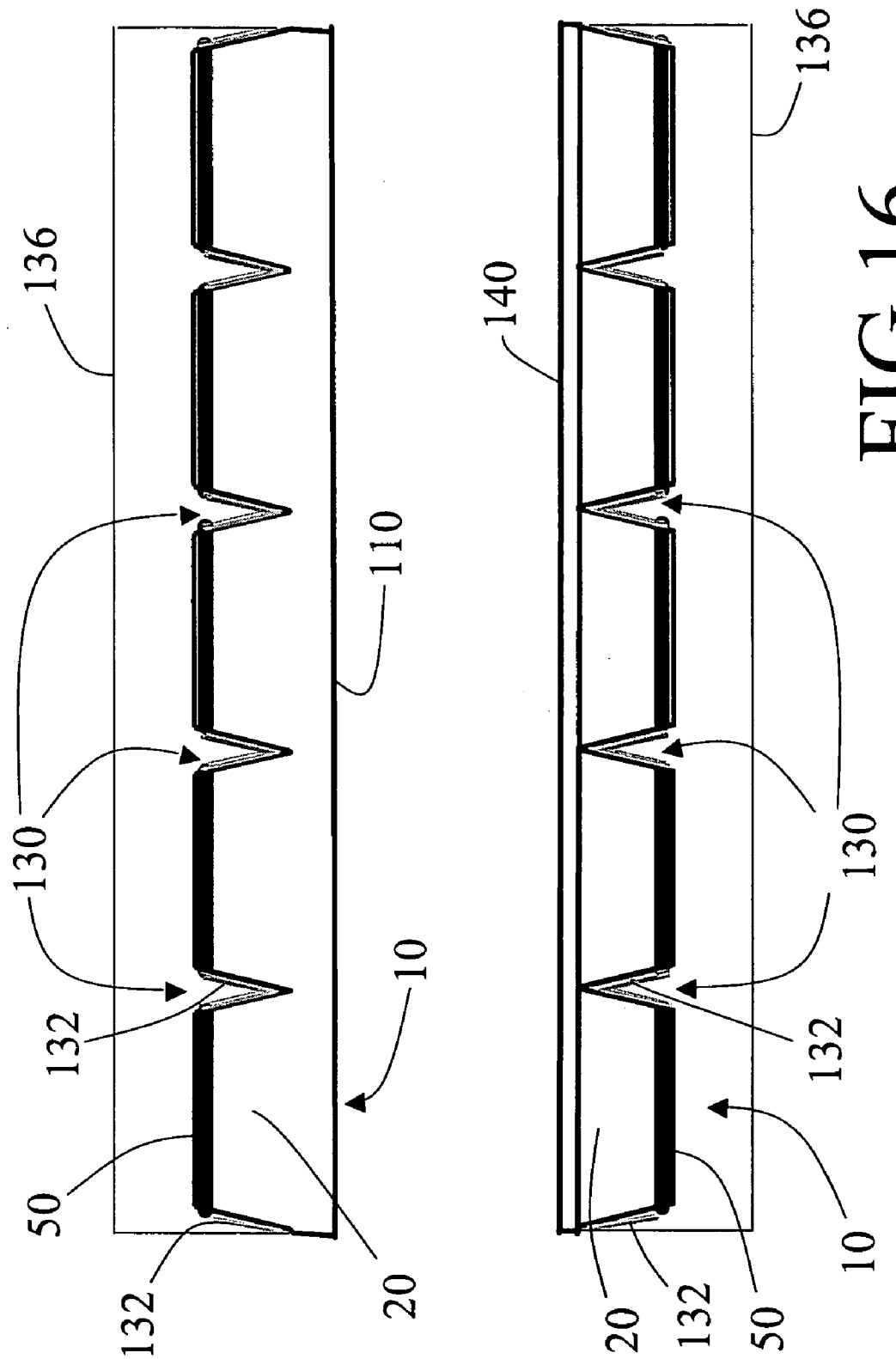

FLIP-CHIP LIGHT EMITTING DIODE DEVICE WITHOUT SUB-MOUNT

BACKGROUND

The present invention relates to the lighting arts. It is especially relates to flip chip light emitting diodes for indicator lights, illumination applications, and the like, and will be described with particular reference thereto. However, the invention will also find application in conjunction with other applications that can advantageously employ surface-mount light emitting diodes.

The flip chip light emitting diode configuration has substantial benefits, including reduced light losses due to shadowing by the electrodes, improved thermal coupling of the active layers with the mount, improved current spreading across the device through the use of larger distributed electrodes, reduction in electrical wiring or wire bonding, and compatibility of the flip chip mounting technique with automated die bonding equipment. Group III-nitride-based light emitting diodes on sapphire or silicon carbide substrates have light-transmissive substrates that are compatible with flip chip bonding. In certain material systems in which the preferred epitaxy substrate is opaque or has poor light extraction properties, the substrate may be thinned, or the epitaxial layers may be transferred to a transparent host substrate after formation.

A problem arises, however, because existing automated device attachment tools typically have tolerances that are too large to reliably flip chip bond light emitting diodes. The electrodes of flip chip light emitting diodes have finely spaced features and structures to optimize current spreading and backside reflection. For example, in an exemplary p-on-n configuration, n-type electrode fingers are arranged in close proximity to p-type mesas to promote lateral current spreading. The n-type electrode fingers are preferably laterally spaced apart by about 0.20 mm to 0.25 mm, with p-type electrode material disposed therebetween. Larger lateral spacings result in increased resistive electrical losses and heating. These fine electrode features impose a tight tolerance on the precision and accuracy of the flip-chip bonding of no larger than about 0.15 mm. Placement errors of greater than about 0.15 mm can result in cross-bonding p-type regions to n-type bonding bumps and vice versa. Similarly stringent tolerance limits are imposed on n-on-p configurations. It is typically difficult or impossible to achieve such tight bonding tolerances in automated die attachment of the flip chip light emitting diode directly to a printed circuit board or other relatively large electrical component. Additionally the fine features on the LED cannot be duplicated in existing printed circuit boards due to limitations in the lithography and transfer processes currently in use.

To accommodate the fine electrode features, a sub-mount is commonly arranged between the light emitting diode and the printed circuit board. The light emitting diode is flip chip bonded to the sub-mount, which is of similar size as the light emitting diode so that precise alignment during die attachment is readily achievable. The sub-mount has a first set of bonding pads for the flip chip bonding, and a second set of more widely spaced-apart electrodes or bonding pads for electrically connecting with the printed circuit board. The sub-mount with the light emitting diode flip chip bonded thereto can be attached to the printed circuit board by a surface-mount technique or by wire-bonding.

Use of a sub-mount, although heretofore generally employed to accommodate tight flip chip bonding tolerances, has substantial disadvantages, including introduction of additional packaging processing that increases manufacturing time and cost. The sub-mount also introduces additional thermal resistance which limits heat sinking efficiency. Mechanical reliability can be compromised by the intervening sub-mount. The sub-mount material usually is selected to be both thermally conductive for heat sinking and electrically insulating to provide electrode isolation. If an electrically conductive sub-mount is used, dielectric layers are applied for electrical isolation. If these layers are too thin, they can capacitively limit switching for in high speed applications. Another consideration is matching thermal expansion coefficients at interfaces between the light emitting diode, the sub-mount, and the printed circuit board.

The present invention contemplates an improved apparatus and method that overcomes the above-mentioned limitations and others.

BRIEF SUMMARY

According to one aspect, a light emitting device is disclosed. A light emitting diode has a backside and a front-side with at least one n-type electrode and at least one p-type electrode disposed thereon defining a minimum electrodes separation. A bonding pad layer includes at least one n-type bonding pad and at least one p-type bonding pad defining a minimum bonding pads separation that is larger than the minimum electrodes separation. At least one fanning layer is interposed between the front-side of the light emitting diode and the bonding pad layer. The at least one fanning layer includes a plurality of electrically conductive paths passing through vias of a dielectric layer to provide electrical communication between the at least one n-type electrode and the at least one n-type bonding pad and between the at least one p-type electrode and the at least one p-type bonding pad.

According to another aspect, a method of flip chip bonding a light emitting diode to a support is provided. The light emitting diode has front-side n-type and p-type electrodes defining a minimum electrodes separation therebetween. A dielectric layer is deposited over at least the front-side of the light emitting diode. The dielectric layer at least partially seals the front-side. Vias accessing the n-type and p-type electrodes are formed through the dielectric layer. A first-type electrical contact is disposed over vias that access a first-type electrode selected from the group consisting of the p-type electrode and the n-type electrode. The first-type electrical contact extends over the dielectric layer between the vias that access the first-type electrode to define a first-type contact pad. A second-type electrical contact is disposed over one or more vias that access a second-type electrode selected from the group consisting of the other of the p-type electrode and the n-type electrode. The second-type electrical contact extends over the dielectric layer to define a second-type contact pad. The first-type contact pad and the second-type contact pad define a minimum contact pads separation therebetween that is larger than the minimum electrodes separation. The first-type contact pad and the second-type contact pad are flip chip bonded to bonding bumps of a substrate via bonding bumps disposed on at least one of the contact pads and the substrate. The bonding pads can include a metal stack, for example for conductive adhesive bonding, or a solderable metal stack, such as an adhesion metal, barrier metal, solderable metal stack, or a metal stack in which the outermost metal is composed of a solder or a solder alloy.

According to yet another aspect, a method is provided of flip chip bonding a light emitting diode having front-side n-type and p-type electrodes defining a minimum electrodes separation therebetween to mechanically secure the light emitting diode to a printed circuit board and to electrically connect the front-side n-type and p-type electrodes with printed circuitry of the printed circuit board. A dielectric layer is disposed over at least the n-type and p-type electrodes. The dielectric layer has vias passing therethrough for accessing the n-type and p-type electrodes. Electrical contact pads are disposed over the vias and the dielectric layer. The electrical contact pads include a p-type contact pad connecting with the p-type electrode through selected vias and an n-type contact pad connecting with the n-type electrode through selected other vias. The contact pads are arranged over the dielectric layer with a minimum contact pads separation therebetween that is larger than the minimum electrodes separation. The contact pads are flip chip bonded to printed circuitry of the printed circuit board via bonding bumps arranged on one of the printed circuit board and the chip. The bumps can include a metal stack, such as a solderable metal stack. The flip-chip bonding has a mechanical tolerance that is greater than the minimum electrodes separation and less than the minimum contact pads separation. There is no sub-mount arranged between the contact pads and the printed circuit board.

According to still yet another aspect, a method of processing a wafer having a plurality of light emitting diodes fabricated thereon is provided. Each light emitting diode has front-side n-type and p-type electrodes defining a minimum electrodes separation therebetween. A dielectric layer is disposed over at least the n-type and p-type electrodes. The dielectric layer has vias passing therethrough for accessing the n-type and p-type electrodes. Electrical contact pads are disposed over the vias and the dielectric layer. The electrical contact pads for each light emitting diode include a p-type contact pad that connects with the p-type electrode and an n-type contact pad that connects with the n-type electrode, the connecting being through the vias. The contact pads for each light emitting diode are arranged over the dielectric layer with a minimum contact pads separation therebetween that is larger than the minimum electrodes separation. After disposing the electrical contact pads, the wafer is diced to separate the light emitting diodes.

Numerous advantages and benefits of the present invention will become apparent to those of ordinary skill in the art upon reading and understanding the present specification.

BRIEF DESCRIPTION OF THE DRAWINGS

The invention may take form in various components and arrangements of components, and in various process operations and arrangements of process operations. The drawings are only for purposes of illustrating preferred embodiments and are not to be construed as limiting the invention. The drawings of the light emitting diode devices are not to scale.

FIG. 3 shows a side sectional view of the flip chip light emitting diode of FIG. 1 along Section A'—A'.

FIG. 4 shows the light emitting diode of FIG. 1 after application of a dielectric layer having vias passing therethrough accessing the n-type and p-type electrodes.

FIG. 5 shows the light emitting diode of FIG. 1 after application of an electrically conductive material defining intermediate connecting pads on the dielectric layer of FIG. 4.

FIG. 10 shows a side sectional view of the flip chip light emitting diode with completed bonding pads shown in FIG. 9, along Section C—C.

FIG. 16 diagrammatically shows a second preferred processing performed after formation of completed bonding pads but before dicing the substrate wafer of FIG. 14, in which a phosphor layer is applied and slanted reflective sidewalls are formed.

DETAILED DESCRIPTION OF PREFERRED EMBODIMENTS

With reference to FIGS. 1–11, a process is described for forming bonding pads on a flip chip light emitting diode 10 in a way which adapts fine features including a small minimum spacing $d_{electrodes}$ between electrodes 12, 14 of the light emitting diode 10 to a larger tolerance of the flip chip bonding process.

Figure 1:
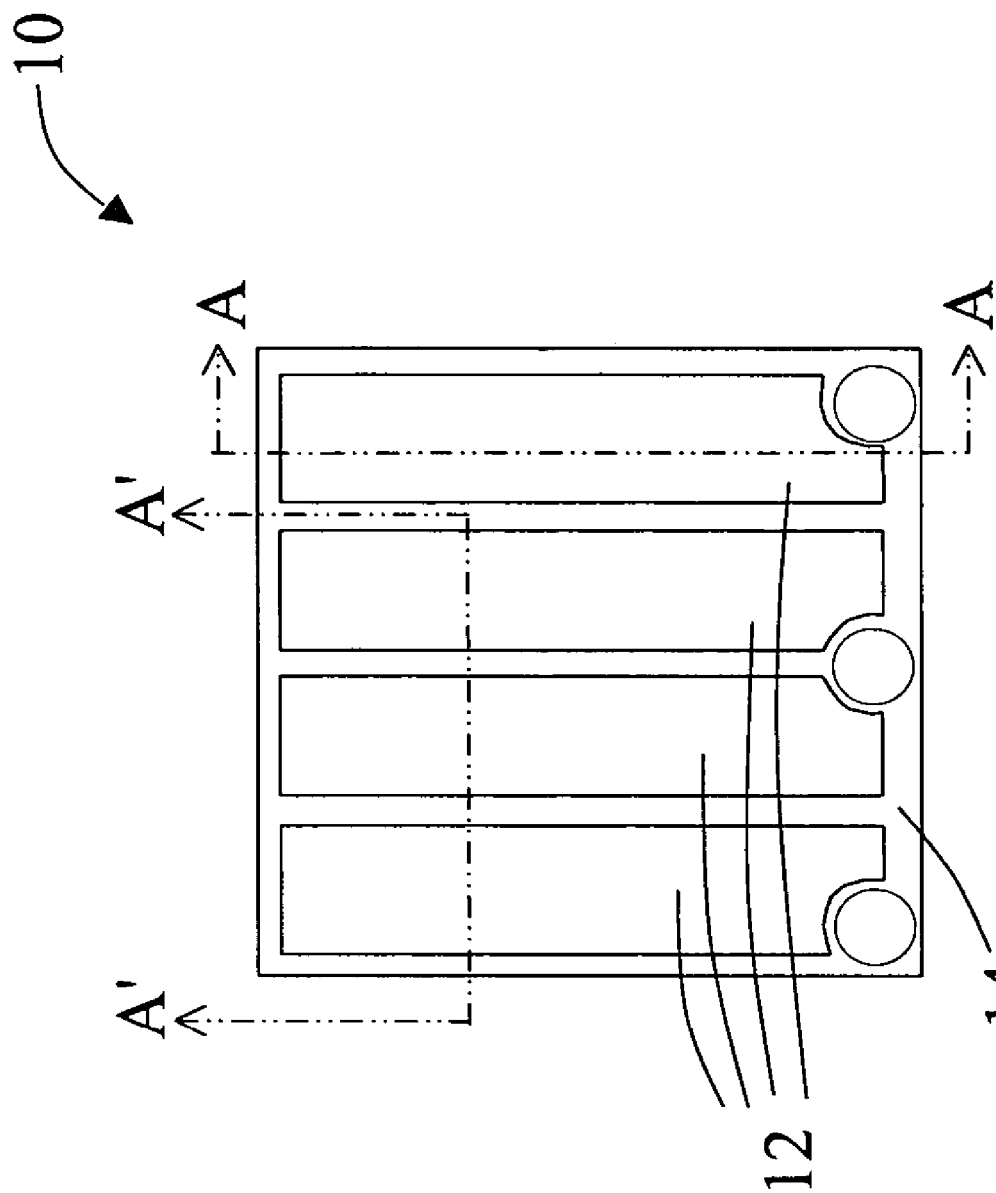
FIG. 1 shows an exemplary flip chip light emitting diode having front-side n-type and p-type electrodes.
Figure 2:
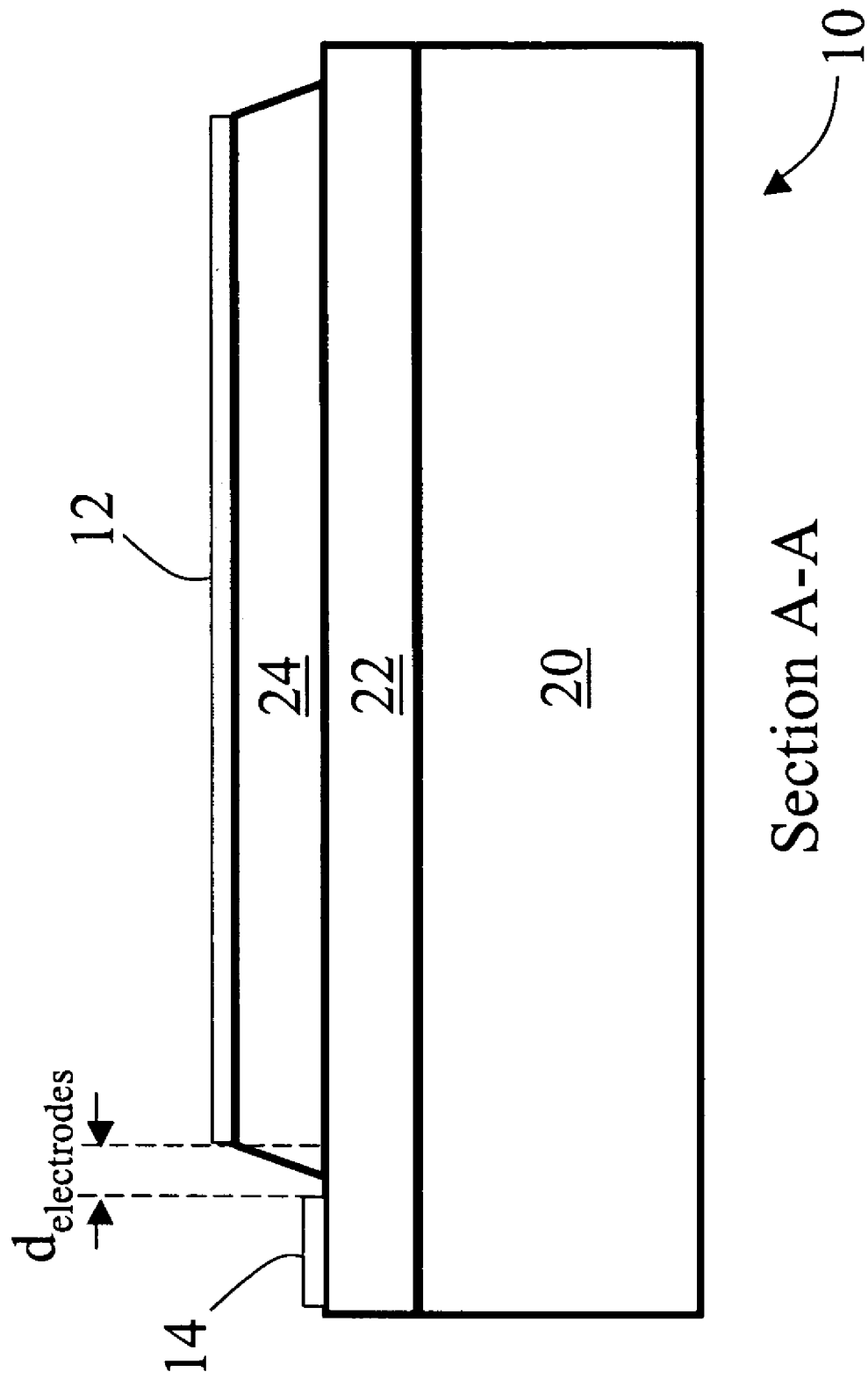
FIG. 2 shows a side sectional view of the flip chip light emitting diode of FIG. 1 along Section A—A.

With reference to FIGS. 1–3, the exemplary light emitting diode 10 prior to formation of the bonding pads includes a substrate 20, an n-type base layer 22, and one or more device mesas 24. To facilitate light extraction in the flip chip bonded configuration, the substrate 20 is preferably substantially light transmissive for light generated by the light emitting diode 10. Optionally, the substrate 20 may be thinned to improve light extraction.

In one preferred embodiment, the light emitting diode 10 is a group III-nitride based light emitting diode, in which the substrate 20 is sapphire or silicon carbide, the n-type base layer 22 is an n-type gallium nitride layer or an n-type aluminum gallium nitride layer, and the device mesa or mesas 24 include an n-type gallium nitride or aluminum gallium nitride cladding layer adjacent the n-type base layer 22, an active region adjacent the n-type cladding layer including one or more indium gallium nitride layers, a p-type gallium nitride or aluminum gallium nitride cladding layer adjacent a side of the active region distal from the substrate 20, and a heavily doped p-type contact-enhancing layer of a group III-nitride material including one or more of indium, gallium, and aluminum adjacent a side of the p-type gallium nitride cladding layer distal from the substrate 20.

Although not shown, the exemplary group III-nitride light emitting diode 10 optionally includes other layers, such as an epitaxy-enhancing buffer layer of aluminum nitride or another material interposed between the substrate 20 and the n-type base layer 22. Other group III-nitride layers can be included elsewhere in the epitaxial layers stack to provide other desired structural, electrical, and/or optical effects, such as current spreading, improved electrical conductance, optical confinement, carrier confinement, abrupt interfaces between layers, and the like. The light emitting diode 10 is suitably formed by heteroepitaxially depositing group III-nitride layers on the substrate 20 and removing selected portions of the deposited layers by lithographic processing to define the device mesa or mesas 24 and to access the n-type material.

The described group III-nitride light emitting diode is exemplary only. The light emitting diode 10 can be constructed using other materials, such as group III-phosphides, group III-arsenides, and the like. Moreover, although formation of the bonding pads is described with reference to the exemplary p-on-n light emitting diode 10, the described bonding pads formation processing is also applicable to n-on-p light emitting diodes.

The light emitting diode 10 is suitably formed by depositing group layers on the substrate 20 and removing material by lithographic processing to define the device mesa or mesas 24 and to expose portions of the n-type base layer 22. The electrodes 12, 14 include one or more p-type electrodes 12 corresponding to and formed on the device mesa or mesas 24 and one or more n-type electrodes 14 formed on exposed portions of the n-type base layer 22. Typically, the electrodes 12, 14 are metal stacks, such as a nickel/titanium/gold stack which is suitable for contacting group III-nitride materials. Those skilled in the art can readily select suitable materials or material stacks for the electrodes 12, 14. As best seen in FIG. 1, the exemplary light emitting diode 10 has four generally rectangular device mesas 24 and a corresponding four generally rectangular p-type electrodes 12. The n-type electrode 14 is arranged as fingers proximate to the four device mesas 24. Those skilled in the art can employ other electrode configurations to enhance current spreading or other diode aspects. Note that in FIG. 1, the small lateral gap $d_{electrodes}$ between the p-type electrodes 12 and the n-type electrode 14 labeled in FIG. 2 is not indicated.

In operation, electroluminescence is generated in the device mesas 24 by electrical current flowing between the electrodes 12, 14. The spacing $d_{electrodes}$ between the electrodes 12, 14 is preferably small to reduce resistance to current flow. Moreover, the device mesas 24 and the n-type electrode 14 are preferably distributed over the lateral area of the light emitting diode 10 to maximize lateral current spreading across the mesa 24.

The fine lateral features of the p-type and n-type electrodes 12, 14 and the small minimum spacing $d_{electrodes}$ therebetween make flip-chip bonding of the light emitting diode 10 directly to a printed circuit board without an interposed sub-mount difficult. To quantify this difficulty, for the exemplary preferred group III-nitride embodiment, the n-type electrode fingers are preferably spaced apart by about 0.20 mm to 0.25 mm. As the p-type electrodes 12 are interposed between the n-type electrode fingers, this makes $d_{electrodes}$ less than the fingers spacing. In To avoid the bonding bumps creating shunts between the p-type electrode 12 and the n-type electrode 14 due to misalignment during the die attach process, the flip chip bonding should be performed with a lateral tolerance of about 0.15 mm or less. Such a tight tolerance is generally not achievable using existing automated die-attachment tools.

To address this problem, a bonding pads formation process described with reference to FIGS. 4–11 is employed to adapt the fine features of the electrodes 12, 14 to the larger tolerance of the flip chip bonding process. The bonding pads formation process includes formation of a fanning layer 30 as shown in FIGS. 4–7. Formation of the fanning layer 30 includes depositing a dielectric layer 32 in which vias 34 are formed to provide access to the p-type electrode 12 and the n-type electrode 14, followed by metallization processing that fills the vias 34 with an electrically conductive material 36 and that forms intermediate connecting pads, specifically an intermediate p-type connecting pad 42 and an intermediate n-type connecting pad 44.

The dielectric layer 32 preferably hermetically seals the n-type and p-type electrodes 12, 14 and the front-side of the light emitting diode 10. The hermetic sealing advantageously allows for optional omission of a separate encapsulant layer during later device packaging. FIG. 4 shows the light emitting diode 10 after the dielectric layer 32 is disposed thereon and the vias 34 are formed, but before the electrically conductive material 36 is disposed. The dielectric layer 32 is suitably a polyamide material; however, other materials such as silicon nitride or silicon dioxide can be used, The dielectric layer 32 shown in FIG. 4 is substantially light transmissive; hence, the lateral structure of the mesas 24 and n-electrode 14 remain visible in FIG. 4 through the dielectric layer 32. However, a translucent or opaque dielectric material can also be employed. To provide adequate electrical isolation, the dielectric layer 32 is preferably at least 2 microns thick. Depending upon the dielectric and structural characteristics of the dielectric layer 32, a thinner dielectric layer may be suitable.

The vias 34 are suitably formed by a lithographic processing after blanket deposition of the preferably hermetically sealing dielectric layer 32. Alternatively, lithographic processing can be used to mask the vias areas during deposition of the dielectric layer 32, after which the mask is removed leaving the vias 34. The vias 34 provide access to the p-type and n-type electrodes 12, 14. In a preferred embodiment, several vias 34 contacting each of the electrodes 12, 14 are distributed across the lateral area of the light emitting diode 10 to promote current spreading across the light emitting diode 10.

The electrically conductive material 36 can be deposited by vacuum evaporation, sputtering, electroplating, or the like. If an evaporative technique is used, a lateral extent of the intermediate p-type and n-type connecting pads 42, 44 is defined by lithographic techniques known in the art. For electroplating, a thin seed layer (not shown) is deposited inside the vias 34 and the electrically conductive material 36 is electroplated to fill the vias 34 and to extend outside the vias 34. Extension or overflowing of the electroplated material outside of the vias is known as "mushrooming" in the art. The electrically conductive material 36 lying outside of the vias 34 defines the connecting pads 42, 44.

Figure 6:
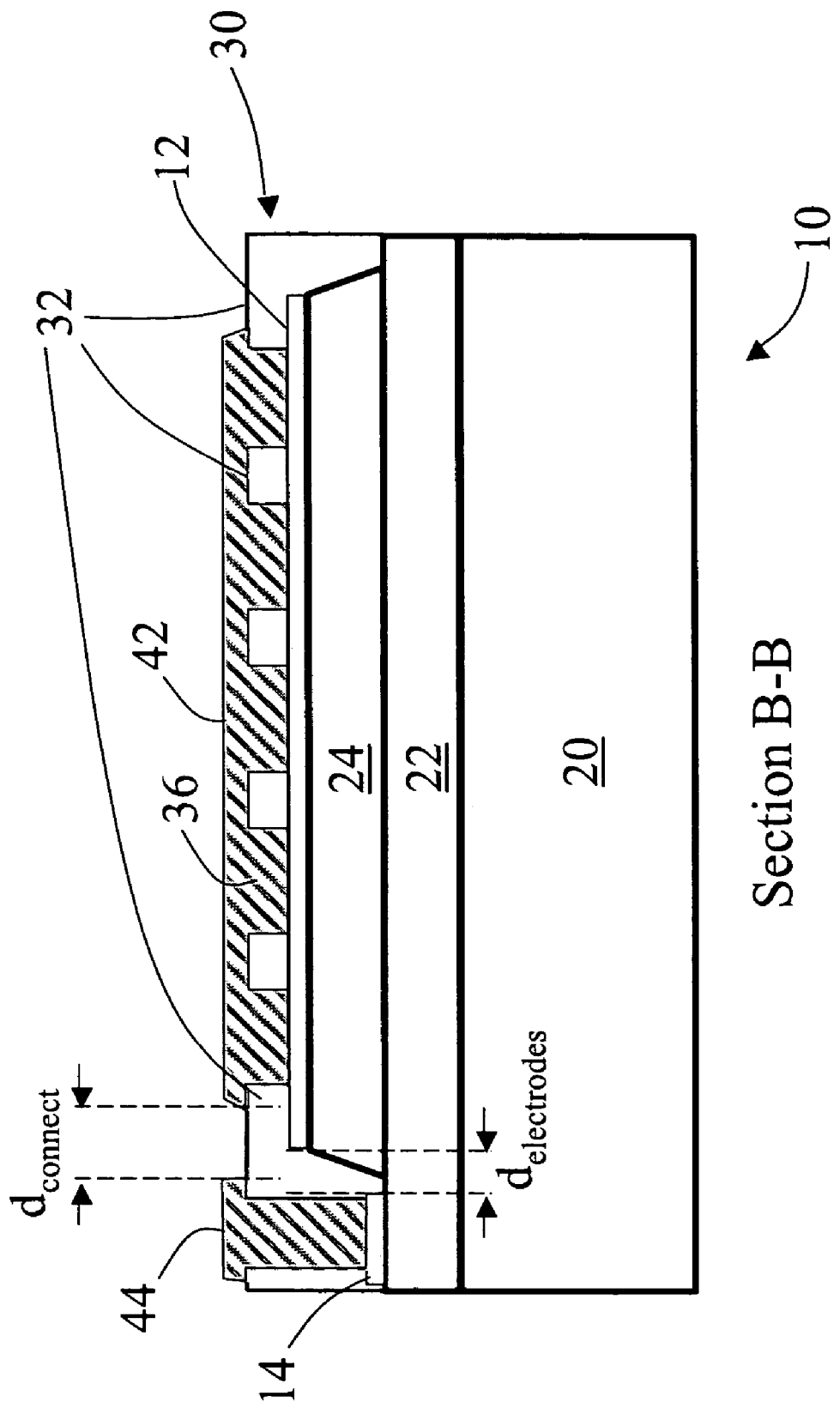
FIG. 6 shows a side sectional view of the flip chip light emitting diode at the processing stage shown in FIG. 5, along Section B—B.
Figure 7:
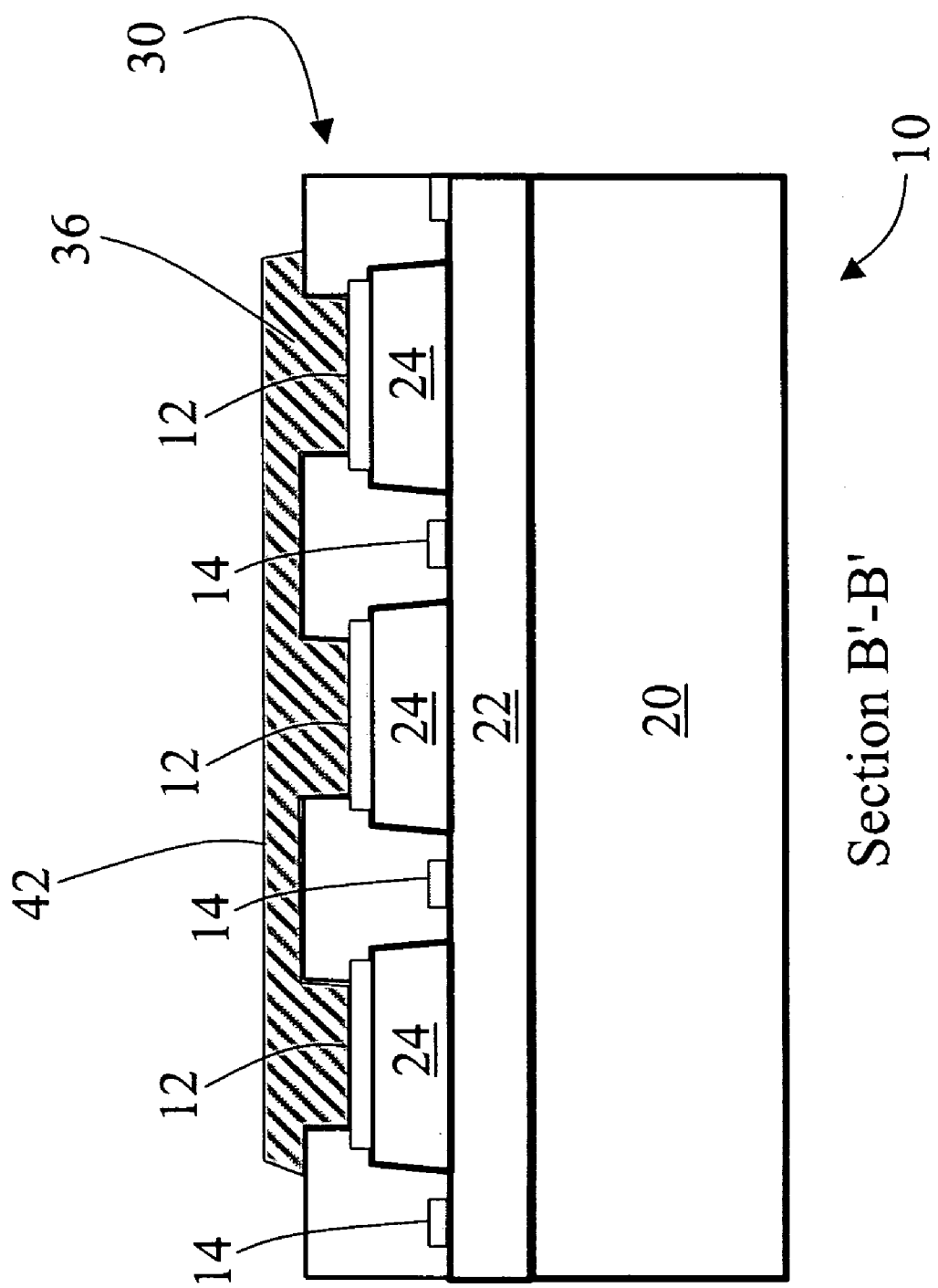
FIG. 7 shows a side sectional view of the flip chip light emitting diode at the processing stage shown in FIG. 5, along Section B'—B'.

Other layers can be included in the disposing of the electrically conductive material 36 which are not shown in FIGS. 6 and 7. Optionally, a thin adhesion layer is disposed between the electrically conductive material 36 and the electrodes 12, 14 to promote adhesion. Similarly, a thin diffusion barrier layer is optionally disposed at an interface between the electrically conductive material 36 and the electrodes 12, 14 to suppress intermixing of the electrically conductive material 36 and the material of the electrodes 12, 14. In a suitable embodiment for a group III-nitride light emitting diode, a thin titanium and/or nickel layer is deposited on the electrodes 12, 14, and the electrically conductive material 36 is gold or silver. Those skilled in the art can readily select other material stacks that control adhesion and intermixing at the interface between the electrodes 12, 14 and the electrically conductive material 36.

The portion of the electrically conductive material 36 residing in the vias 34 define electrically conductive paths providing electrical communication between the electrodes 12, 14 and the connecting pads 42, 44. Preferably, the connecting pads 42, 44 have a minimum separation $d_{connect}$ that is greater than the minimum electrodes separation $d_{electrodes}$. As best seen in FIGS. 5–7, the intermediate p-type connecting pad 42 extends laterally across the dielectric layer 32 to connect the vias that access the p-type electrode 12 and to connect the four device mesas 24 to define a single p-type connecting pad 42. Similarly, as best seen in FIG. 5 the n-type connecting pad 44 extends laterally across the dielectric layer 32 to connect the vias that access the n-type electrode 14 to define a single n-type connecting pad 44. Furthermore, the connecting pads 42, 44 are preferably thick enough so that the pads 42, 44 are not limiting sources of electrical resistance. Pad thicknesses of about a micron or thicker are preferred.

The connecting pads 42, 44 have a lateral configuration that is advantageously better adapted for flip chip bonding than the lateral configuration of the electrodes 12, 14. First, the connecting pads 42, 44 have a simple rectangular geometry that does not follow the complex lateral configuration of the four mesas 24 and the fingers of the n-type electrode 14. Thus, bonding bumps on a printed circuit board for die attachment can have a correspondingly simple geometry. Second, the minimum separation $d_{connect}$ of the connecting pads 42, 44 is larger than the minimum electrodes separation $d_{electrodes}$. The minimum separation is related to the maximum lateral tolerance that can be permitted in the flip chip bonding process, since for a small separation a correspondingly small error in lateral alignment during die attachment can shunt the separation. Hence, the larger minimum separation $d_{connect}$ of the connecting pads 42, 44 permits larger lateral tolerances in the flip chip bonding process.

Because of these advantages, the device as shown in FIGS. 5–7 with the fanning layer 30 disposed on the front-side of the light emitting diode 10 is contemplated for direct flip chip bonding without a sub-mount to a printed circuit board, using the connecting pads 42, 44 as bonding pads. In this embodiment, the connecting pads 42, 44 are optionally coated with a bonding layer or layers stack (not shown) that promotes soldering, reflow alloy bonding, or another selected bonding method for electrically and mechanically securing the light emitting diode 10 to bonding bumps of a printed circuit board.

With further reference to FIGS. 8–11, however, in a preferred embodiment the bonding pads fabrication process is continued to produce a second, bonding pad layer 50 on top of the fanning layer 30. Although the connecting pads 42, 44 provide a substantial adaptation for direct flip chip bonding of the LED 10 to a printed circuit board without a sub-mount, they have certain deficiencies. The vias 34 that communicate between the p-type electrode 12 and the p-type connecting pad 42 impose a substantial lateral overlap between the p-type electrode 12 and the p-type connecting pad 42. This overlap constrains a maximum size of the minimum separation $d_{connect}$ of the connecting pads 42, 44. To provide a larger separation, the bonding pad layer 50 is disposed on a side of the fanning layer 30 that is distal from the electrodes 12, 14.

Formation of the bonding pad layer 50 includes deposition of a second dielectric layer 52 in which vias 54 that provide access to the p-type connecting pad 42 and the n-type connecting pad 44 are formed, followed by a metallization process that fills the vias 54 with an electrically conductive material 56 (which may be the same as the electrically conductive material 36, or which may be different from the electrically conductive material 36) and forms bonding pads, specifically a p-type bonding pad 62 and an n-type bonding pad 64.

Figure 8:
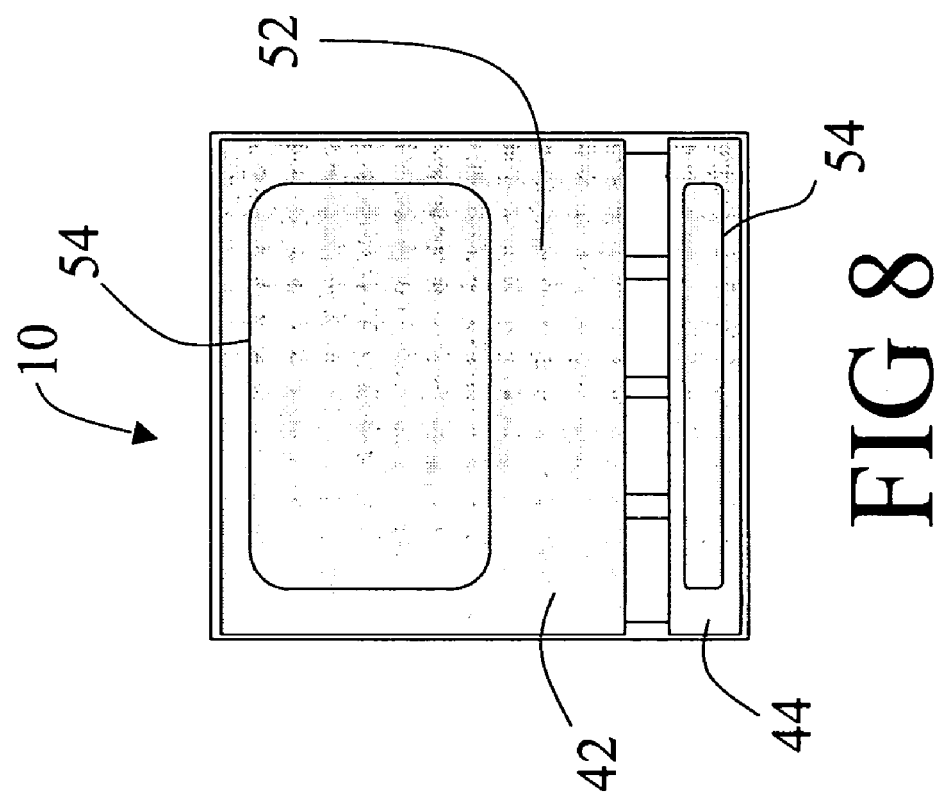
FIG. 8 shows the light emitting diode of FIG. 1 after application of a second dielectric layer disposed over the intermediate connecting pads shown in FIG. 5.

FIG. 8 shows the light emitting diode 10 after the second dielectric layer 52 is disposed thereon and the vias 54 are formed, but before disposition of the electrically conductive material 56. The second dielectric layer 52 is suitably a polyamide material, although other materials such as silicon nitride or silicon dioxide can be used. The second dielectric layer 52 shown in FIG. 8 is substantially light transmissive; hence, the intermediate connecting pads 42, 44 remain visible in FIG. 8 through the second dielectric layer 52. However, a translucent or opaque dielectric material can also be employed. To provide adequate electrical isolation, the dielectric layer 52 is preferably at least 2 microns thick. Depending upon the dielectric and structural characteristics of the dielectric layer 52, a thinner dielectric layer may be suitable. The second dielectric layer 52 may be made of the same material as the dielectric layer 32, or it may be made of a different material.

The vias 54 are suitably formed by a lithographic process after blanket deposition of the second dielectric layer 52. Alternatively, lithographic processing can be used to mask the vias areas during deposition of the dielectric layer 52, after which the mask is removed leaving the vias 54. The vias 54 provide access to the p-type and n-type intermediate connecting pads 42, 44. The electrically conductive material 56 can be deposited by vacuum evaporation, sputtering, electroplating, or the like. In the case of evaporative techniques, a lateral extent of the intermediate p-type and n-type bonding pads 62, 64 is defined by lithographic techniques known in the art.

Figure 11:
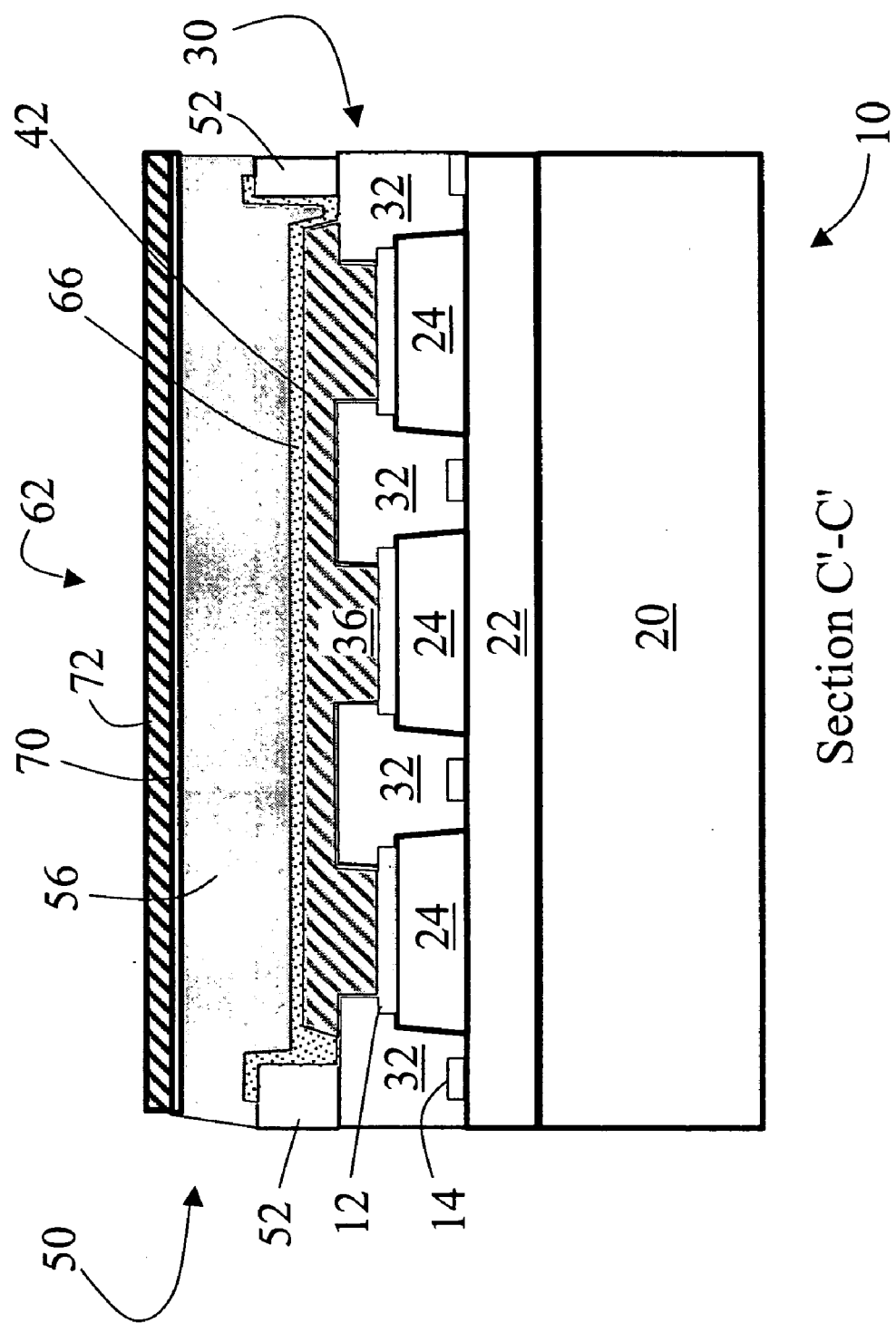
FIG. 11 shows a side sectional view of the flip chip light emitting diode with completed bonding pads shown in FIG. 9, along Section C'—C'.

FIGS. 10 and 11 illustrate an electroplating embodiment in which a thin seed layer 66 is deposited inside the vias 54 and the electrically conductive material 56 is electroplated to fill the vias 54 and to mushroom outside the vias 54 to define the bonding pads 62, 64. Other layers can be included in the disposing of the electrically conductive material 56 which are not shown in FIGS. 10 and 11. Optionally, a thin adhesion layer and/or diffusion barrier layer is interposed between the electrically conductive material 56 and the intermediate connecting pads 42, 44. In one suitable embodiment, a thin titanium and/or nickel layer is deposited on the intermediate connecting pads 42, 44 and the electrically conductive material 56 is gold or silver. Those skilled in the art can readily select other material stacks that control adhesion and intermixing at the interface between the intermediate connecting pads 42, 44 and the electrically conductive material 56.

The portion of the electrically conductive material 56 residing in the vias 54 define electrically conductive paths providing electrical communication between the connecting pads 42, 44 and the bonding pads 62, 64. Preferably, the bonding pads 62, 64 have a minimum separation $d_{pads}$ that is greater than the minimum electrodes separation $d_{electrodes}$ and that is greater than the minimum separation $d_{connect}$ of the intermediate connecting pads 42, 44. The bonding pads 62, 64 are preferably thick enough so that the pads 62, 64 are not limiting sources of electrical resistance, and are also preferably thick enough to participate in the selected die attach process. Thicknesses of the bonding pads 62, 64 of about two microns or thicker are preferred, although thinner bonding pads can be employed.

Figure 9:
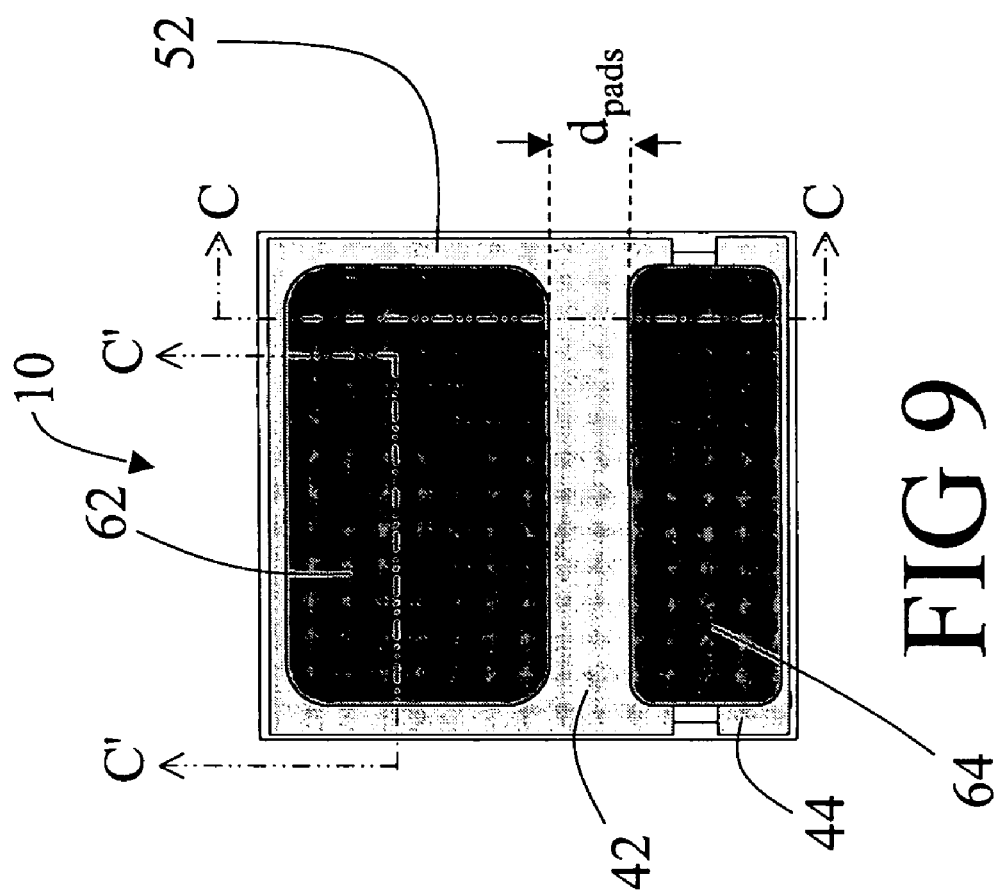
FIG. 9 shows the light emitting diode of FIG. 1 after completion of the bonding pads formation process.
Figure 12:
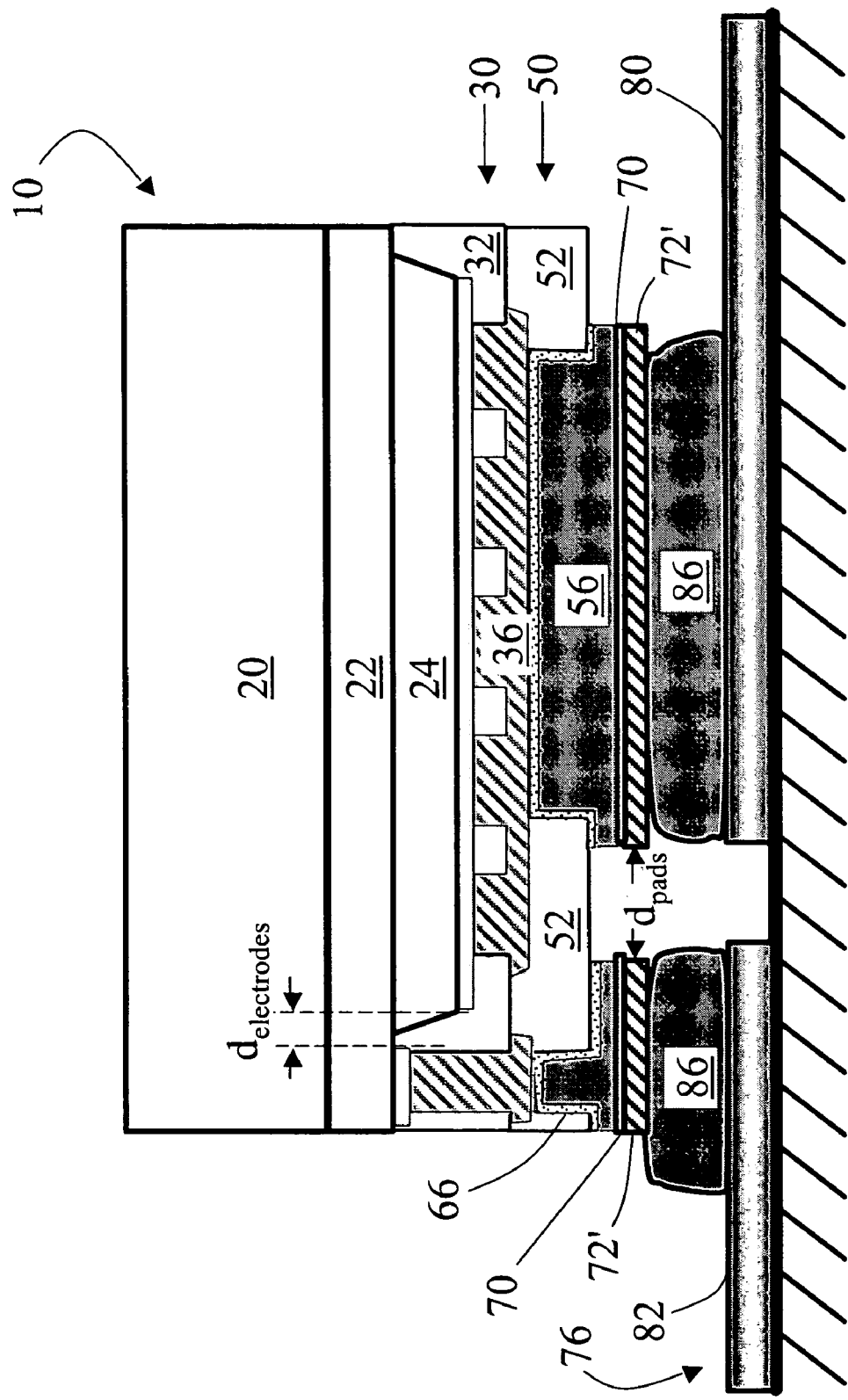
FIG. 12 shows a side sectional view of the flip chip light emitting diode with completed bonding pads shown in FIG. 9, along Section C—C, after flip chip bonding to a printed circuit board.

With continuing reference to FIGS. 9–11 and with further reference to FIG. 12, a preferred flip chip bonding is described which employs a reflow bonding process. As seen in FIGS. 10 and 11, the bonding pads 62, 64 are coated with a diffusion barrier layer 70 and a reflow layer stack 72. In one suitable embodiment, the diffusion barrier layer 70 is a nickel layer and the reflow stack 72 is a gold/tin stack having a desired composition. The reflow stack 72 can be configured as distinct layers, staggered layers, or mixed layers to provide the desired diffusion characteristics during reflow.

With reference to FIG. 12, the light emitting diode 10 is flip chip bonded to a printed circuit board 76 (partially shown in FIG. 12) having printed circuitry including at least positive and negative power traces 80, 82 on which bonding bumps 86 are disposed. The bonding bumps can be gold- or silver-plated copper bumps, gold bumps, silver bumps, or the like. The bonding bumps 86 can include multiple layers, such as a stack including an adhesion layer, a diffusion barrier layer, and a bondable layer. The bonding bumps 86 laterally align with the bonding pads 62, 64 for flip chip bonding. Die attachment is achieved by reflow alloying of the reflow layer 72 with material of the bonding bumps 86. The reflow alloying is performed using a heat source such as an infra-red or convection reflow oven, a vapor phase, convection, or hotplate heat source, or the like. For a gold/tin reflow stack 72, the heating should elevate the temperature of the reflow stack 72 to greater than about 232° C. corresponding to the tin melting point, to effect reflow alloying. The reflow causes alloying at the interface between the reflow stack 72 and the bonding bumps 86 to form mechanically secure and electrically conductive bonds 72'. For certain material combinations, an oxide reducing flux is advantageously applied to the die attach area to promote the reflow bonding process.

Although the described reflow process is preferred, the flip chip bonding attachment can be made using thermosonic bonding, ultrasonic bonding, conventional soldering, or the like. Moreover, while bonding to the printed circuit board 76 is described, the die attach techniques described herein can be used for die attach to substantially any type of substrate, such as a glass substrate, or a substrate of a composite material.

The preferred process for fabricating bonding pads described with reference to FIGS. 4–11 employs two layers, namely the fan layer 30 and the bonding pads layer 50.

Figure 13:
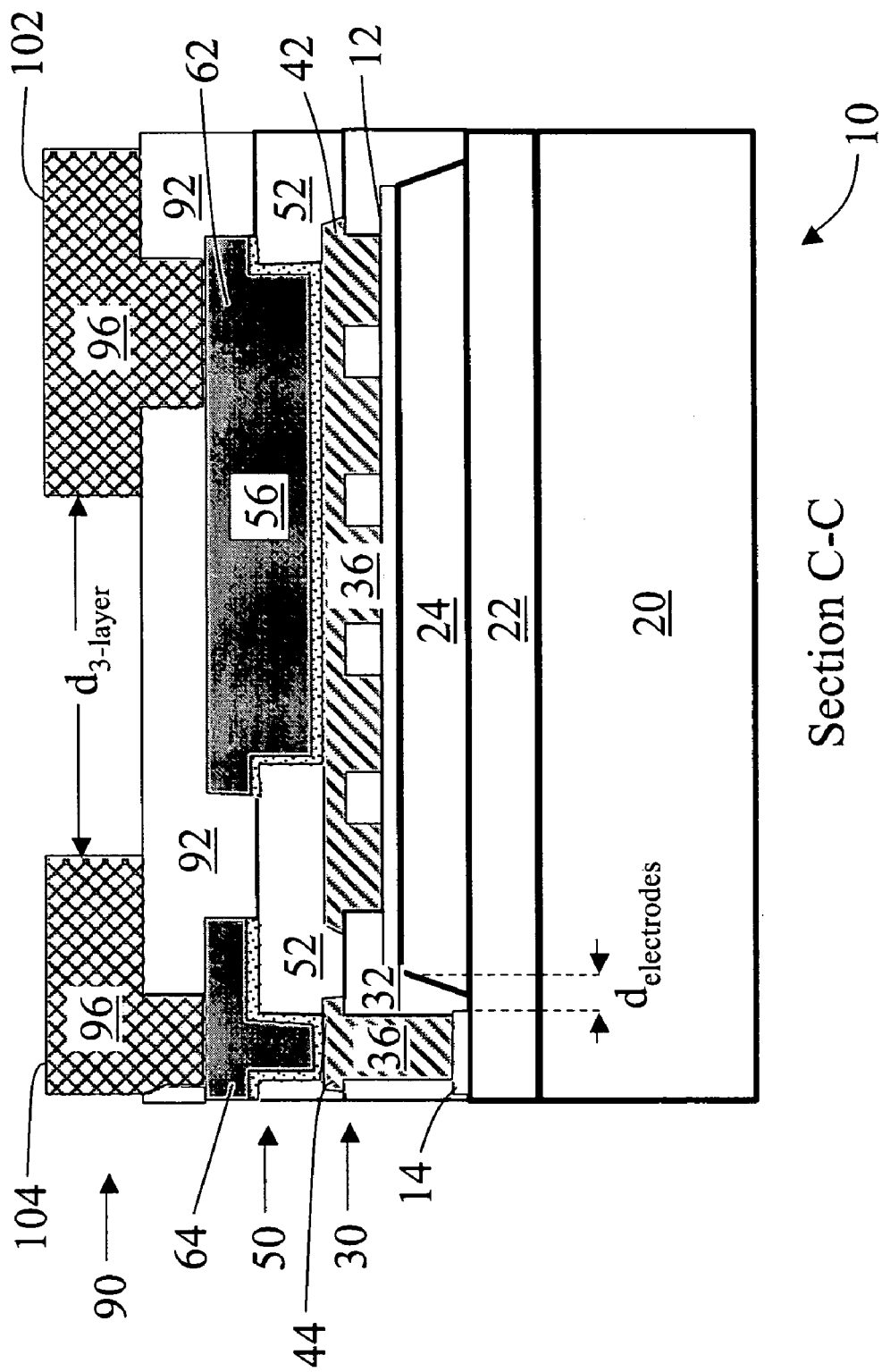
FIG. 13 shows a side sectional view of the flip chip light emitting diode with completed bonding pads shown in FIG. 9, along Section C—C, after additional processing to form a third layer defining bonding pads with a yet larger minimum separation and a higher amount of symmetry.

With reference to FIG. 13, the bonding pad processing can be extended to three layers. In the three-layer embodiment shown in FIG. 13, the bonding pad layer 50 serves as a second fan layer, and the p-type and n-type bonding pads 62, 64 serve as a second set of intermediate connecting pads. A third layer 90 is disposed over the second layer 50. Formation of the third layer 90 includes depositing a third dielectric layer 92 followed by a metallizing process that fills vias through the dielectric layer 92 accessing the pads 62, 64 with an electrically conductive material 96 that also extends over the dielectric layer 92 to define exposed p-type and n-type bonding pads 102, 104.

As seen in FIG. 13, the third layer 90 has a minimum bonding pads separation $d_{3\text{-}layer}$ that is even larger than the minimum bonding pads separation $d_{pads}$ of the second layer 50. Moreover, the bonding pads 102, 104 are advantageously more symmetric with respect to the lateral area of the light emitting diode 10 than are the pads 62, 64. As seen in FIG. 13, moving upward from the intermediate p-type connecting pad 42 to the p-type pad 62 which acts as a second intermediate connecting pad to the exposed bonding pad 102, the center of the p-type contact region shifts outwardly toward an edge of the light emitting diode 10. Similarly, moving upward from the intermediate n-type connecting pad 44 to the n-type pad 64 which acts as a second intermediate connecting pad to the exposed bonding pad 104, the center of the n-type contact region shifts inwardly from an edge of the light emitting diode 10. Since the p-type electrode 12 was positioned near the center of the light emitting diode 10 while the n-type electrode 14 was positioned near an edge of the light emitting diode 10, the result of this shifting is that the exposed bonding pads 102, 104 are more nearly symmetrically arranged respective to the light emitting diode 10 than are the electrodes 12, 14. Such symmetry coupled with the large minimum bonding pads separation $d_{3\text{-}layer}$ accommodates substantial lateral tolerances in the flip chip bonding process.

With reference to FIGS. 4–13, bonding pads fabrication processes that produce one, two, or three layers have been described. Each additional layer provides additional fanning to increase the minimum separation between the n-type and p-type pads. Each additional layer provides additional flexibility in arranging the topmost exposed bonding pads. The described processing is readily extended to four or more layers to provide still greater flexibility; however, as fabrication of each layer involves several processes including at least dielectric deposition, lithography to form vias, and metallization, the number of layers is preferably kept small. Typically, the two layer process whose culmination is shown in FIGS. 9–12 is preferred, while the three layer process whose culmination is shown in FIG. 13 may be preferred for use in conjunction with die attachment processes having especially large tolerances.

FIGS. 1–13 illustrate the bonding pads fabrication process applied to a single light emitting diode 10. In a preferred embodiment, however, the described processing is applied at wafer level, with the wafer diced after formation of the pads 42, 44 (for a one-layer process), or after formation of the bonding pads 62, 64 (for a two-layer process), or after formation of the bonding pads 102, 104 (for a three-layer process).

Figure 14:
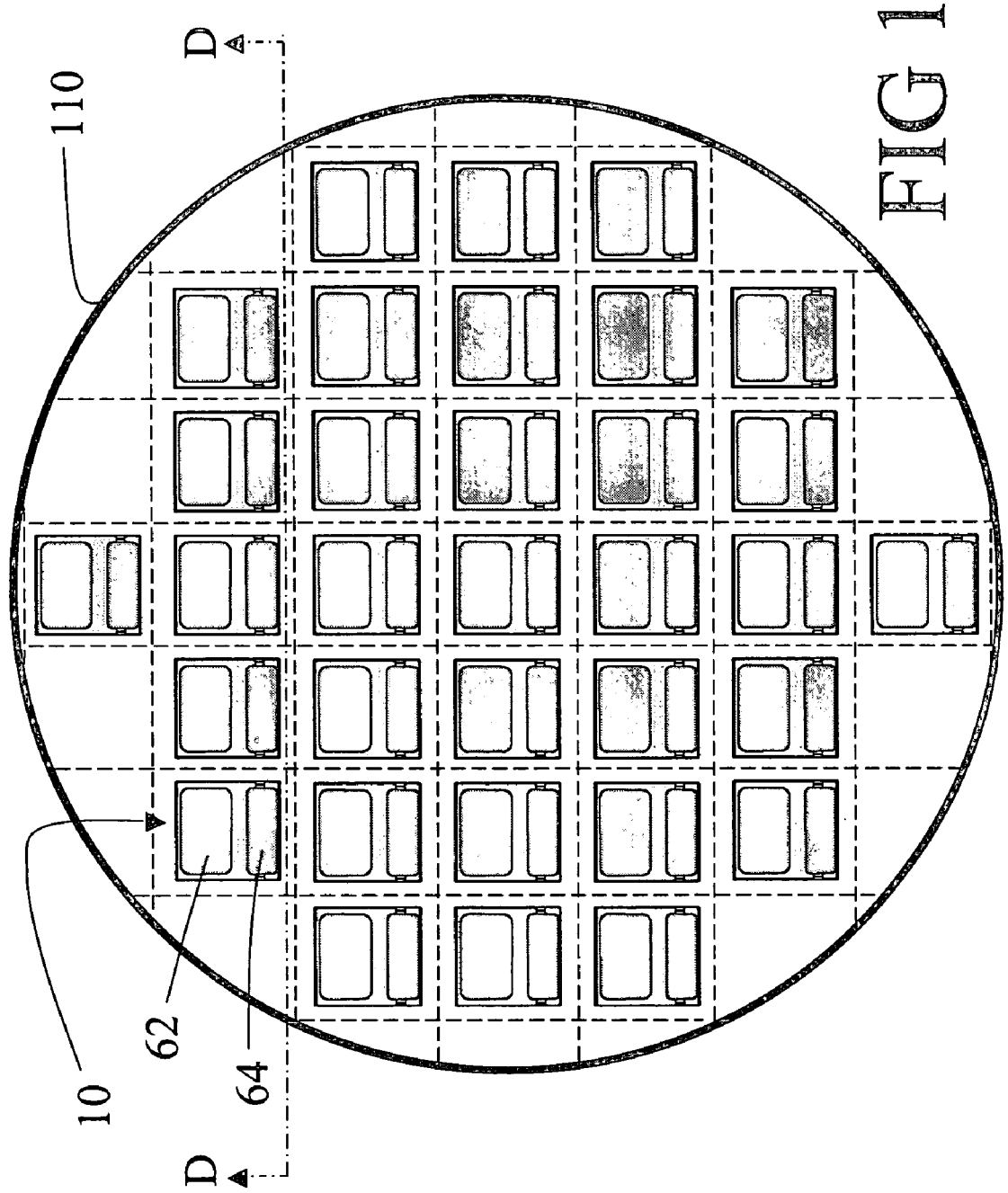
FIG. 14 shows the light emitting diode of FIG. 9 with completed bonding pads formation, in its preferred embodiment as part of a substrate wafer having other light emitting diodes fabricated thereon.

In other words, with reference to FIG. 14, the substrate 20 of the light emitting diode 10 is preferably a portion of a substrate wafer 110 that is shared with other light emitting diodes. As shown in FIG. 14, the substrate wafer 110 has a plurality of light emitting diodes fabricated thereon using wafer-level processing, including the exemplary light emitting diode 10. The light emitting diode 10 has the bonding pads 62, 64 (for the exemplary two-layer process) which are fabricated in accordance with the bonding pads fabrication described herein applied as wafer-level processing. Thus, all the light emitting diodes on the substrate wafer 110 have bonding pads corresponding to the bonding pads 62, 64.

In FIG. 14, the preferred dicing of the substrate wafer 110 after formation of the bonding pads 62, 64 is indicated by dashed die separation lines. Moreover, in a preferred embodiment additional wafer-level processing including at least disposition of one or more optical components on the light emitting diode 10 and on the other light emitting diodes of the substrate wafer 110 is performed after formation of the bonding pads 62, 64 but before the dicing.

Figure 15:
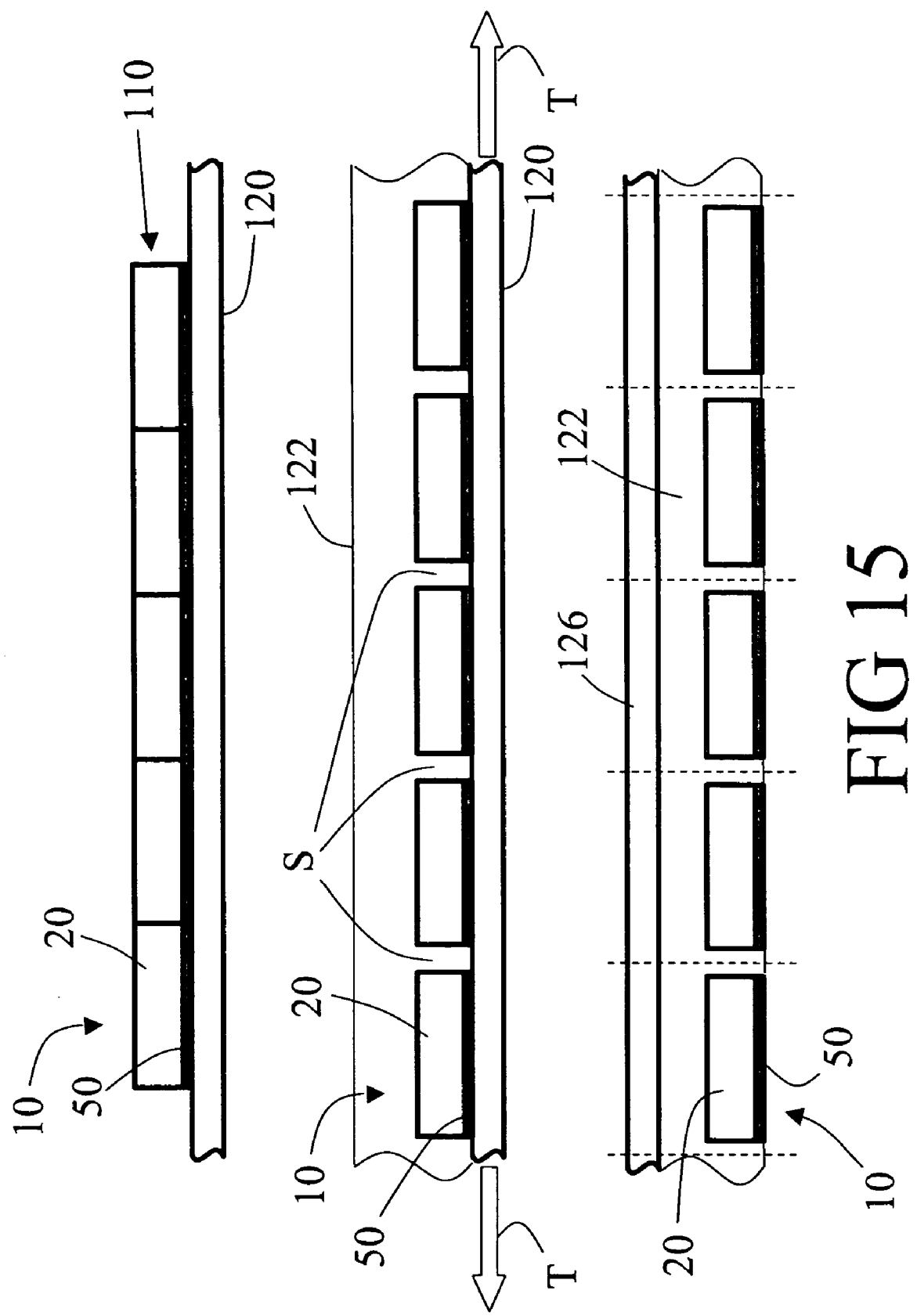
FIG. 15 diagrammatically shows a first preferred processing performed after formation of completed bonding pads but before dicing the substrate wafer of FIG. 14, in which an encapsulant is applied.

With reference to FIG. 15, one suitable processing sequence applied after the bonding pads are fabricated is described. In this processing sequence, an encapsulant of selected thickness is applied to the transparent substrate 20 and sidewalls. The encapsulant provides improved light extraction through better index-matching, and optionally provides some refractive focusing.

FIG. 15 shows the processing by diagrammatically showing the substrate wafer 110 along the section D—D indicated in FIG. 14 at three points during the processing. The description particularly focuses on the exemplary light emitting diode 10. The substrate wafer 110 is adhered to a stretchable sticky tape 120 in a face-down position, that is, with the bonding pads layer 50 adjacent the sticky tape. Dicing is performed from the backside (i.e., from the side of the substrate 20) after securing to the tape 120. The dicing is performed using a diamond scribe, laser cutting, or the like. After the dicing, a tension force T (diagrammatically indicated by arrows) is applied to the tape 120 to introduce a selected separation S between the dice. After the tensioning, an encapsulant 122 such as an epoxy is applied to the backside of the dice, and also flows into the separations S. The encapsulant 122 is cured at a low temperature. After curing, the encapsulated dice are removed from the tensioned stretchable sticky tape 120 and are placed encapsulant-down on a second tape 126 for dicing of the encapsulant. The dicing of the encapsulant is indicated by vertical dashed lines in the lower portion of FIG. 15.

The resulting devices are suitable for flip chip bonding as shown in FIG. 12. Advantageously, each die has a fixed thickness of encapsulant on the backside controlled by the thickness of the deposited encapsulant 122, and a fixed thickness of encapsulant on the sidewalls controlled by the separation S produced by the tensioning T.

With reference to FIG. 16, another suitable processing sequence applied after the bonding pads are fabricated is described. In this processing sequence, a phosphor layer of selected thickness is applied to the transparent substrate 20, and slanted sidewalls are formed and coated with a reflective coating. As is known in the art, group III-nitride light emitting diodes producing ultraviolet or blue electroluminescence are advantageously combined with a white, yellow, or other phosphor to generate substantially white light.

FIG. 16 shows the processing by diagrammatically showing the substrate wafer 110 along the section D—D indicated in FIG. 14 at two points during the processing. The description particularly focuses on the exemplary light emitting diode 10. The substrate wafer 110 is initially processed by making wedge-shaped cuts 130 formed from the front-side using a laser or other cutting device. A reflective coating 132 is disposed in the cuts 130 by electroplating, vacuum evaporation, or the like. The wafer is then mounted face-down on a wax 136 to provide mechanical support, and the substrate 20 is thinned. This thinning is done as a wafer-level process; that is, a backside of the substrate wafer 110 including the substrate 20 is thinned. A phosphor coating 140 is applied to the backside and cured at low temperature. The wax 136 is then removed and the dice are separated at the cuts 130 to isolate, for example, the light emitting diode 10.

The resulting devices are suitable for flip chip bonding as shown in FIG. 12. Advantageously, the reflective coating 132 and the wafer thinning improve light extraction into the phosphor coating 140, while the phosphor coating 140 provides a selected light conversion, for example from ultraviolet to white light for a group III-nitride light emitting diode.

The processing sequences of FIGS. 15 and 16 are applied after the bonding pads are fabricated, and are exemplary only. Those skilled in the art can readily modify the exemplary processing sequences for specific applications. It will be appreciated that the processing sequences of FIGS. 15 and 16 are enabled by the hermetic sealing of the front-side of the light emitting diode 10 by the encapsulant 32, and more generally by the bonding pad layer or layers 30, 50, 90. By forming the bonding pads including hermetic sealing of the front-side before performing the end processing sequences of FIGS. 15 and 16, wafer-level the end processing can be performed without additional intervening processes for protecting the relatively delicate front surface.

For example, in certain existing wafer-level processing, the front-side is protected by applying a thick photoresist to the front-side prior to processing. This has a number of disadvantages, including chemical contamination of the front-side by hydrocarbons or other substances in the photoresist, possible contamination of the processing tools by the photoresist, and additional time and cost of the photoresist application and stripping. By first applying the bonding pads processing as wafer-level processing as described herein, and then performing end processing such as the processes of FIGS. 15 and 16, the need for a protective thick photoresist coating is obviated.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

What is claimed is:

1. A method of flip chip bonding a light emitting diode to a support, the light emitting diode having front-side n-type and p-type electrodes defining a minimum electrodes separation therebetween, the method including:
   disposing a dielectric layer over at least the front-side of the light emitting diode, the dielectric layer sealing the n-type and p-type electrodes;
   disposing a first-type electrical contact over vias through the dielectric layer that access a first-type electrode selected from the group consisting of the p-type electrode and the n-type electrode, the first-type electrical contact extending over the dielectric layer between the vias that access the first-type electrode to define a first-type contact pad;
   disposing a second-type electrical contact over one or more vias through the dielectric layer that access a second-type electrode selected from the group consisting of the other of the p-type electrode and the n-type electrode, the second-type electrical contact extending over the dielectric layer to define a second-type contact pad, the first-type contact pad and the second-type contact pad defining a minimum contact pads separation therebetween that is larger than the minimum electrodes separation; and
   flip-chip bonding the first-type contact pad and the second-type contact pad to a substrate via bonding bumps disposed on at least one of the contact pads and the substrate.

2. The method as set forth in claim 1, wherein the flip-chip bonding employs a bonding process having a lateral tolerance that is larger than the minimum electrodes separation and smaller than the minimum contact pads separation.

3. The method as set forth in claim 1, wherein the disposing of the first-type electrical contact and the disposing of the second-type electrical contact each include depositing a reflow stack, the flip chip bonding including:
heating to effect reflow bonding between the contact pads and the bonding bumps.

4. The method as set forth in claim 3, wherein the heating is performed at a temperature greater than a melting point of at least one component of the reflow stack.

5. The method as set forth in claim 4, wherein the reflow stack includes a tin layer and the heating is performed at a temperature greater than about 232° C.

6. The method as set forth in claim 3, wherein the flip chip bonding further includes:
prior to the heating, disposing an oxide-reducing flux between the contact pads and the bonding bumps of the substrate.

7. The method as set forth in claim 1, wherein the disposing of a first-type electrical contact over the vias that access the first-type electrode includes:
depositing a seed layer in the vias that access the first-type electrode; and
electroplating to fill the first vias that access the first-type electrode.

8. The method as set forth in claim 7, wherein the disposing of a first-type electrical contact over the vias that access the first-type electrode further includes:
continuing the electroplating after the vias that access the first-type electrode are filled such that the electroplated material mushrooms outside of the vias to form the first-type contact pad.

9. The method as set forth in claim 1, wherein the disposing of a first-type electrical contact over vias that access the first-type electrode includes:
depositing an electrically conductive material over the vias that access the first-type electrode and over the dielectric layer between the vias that access the first-type electrode.

10. The method as set forth in claim 1, wherein the flip chip bonding is one of conductive adhesive bonding and soldering.

11. The method as set forth in claim 1, wherein the disposing of a dielectric layer over the front-side of the light emitting diode includes:
depositing a polyamide dielectric layer having a thickness of at least 2 microns.

12. The method as set forth in claim 1, wherein the light emitting diode having front-side n-type and p-type electrodes includes a substrate wafer that has other light emitting diodes formed thereon, the method further including:
subsequent to the disposing of the dielectric layer, the disposing of the first-type electrical contact, and the disposing of the second-type electrical contact, dicing the substrate wafer to isolate at least said light emitting diode having front-side n-type and p-type electrodes from the other light emitting diodes.

13. The method as set forth in claim 12, further including:
subsequent to the disposing of the dielectric layer, the disposing of the first-type electrical contact, and the disposing of the second-type electrical contact, and prior to the dicing, performing at least one wafer-level process.

14. The method as set forth in claim 13, wherein the performing of at least one wafer level process includes at least one of:
encapsulating a back-side of the substrate wafer that is opposite the front-side, and
applying a phosphor to a back-side of the substrate wafer that is opposite the front-side.

15. The method as set forth in claim 1, wherein the flip-chip bonding of the first-type contact pad and the second-type contact pad to a substrate via bonding bumps disposed on at least one of the contact pads and the substrate includes flip chip bonding via one of:
one or more metal stacks defining bonding bumps,
one or more solderable alloy bonding bumps, and
one or more bonding bumps disposed on the contact pads, each bonding bump including a barrier metal.

16. A method of flip chip bonding a light emitting diode having front-side n-type and p-type electrodes defining a minimum electrodes separation between the n-type and p-type electrodes to mechanically secure the light emitting diode to a printed circuit board and to electrically connect the front-side n-type and p-type electrodes with printed circuitry of the printed circuit board, the method including:
disposing a dielectric layer over at least the n-type and p-type electrodes, the dielectric layer having vias passing therethrough, the vias including at least one via accessing the n-type electrode and at least one via accessing the p-type electrode;
disposing electrical contact pads over the vias and the dielectric layer, the electrical contact pads including a p-type contact pad connecting with the p-type electrode through the at least one via accessing the p-type electrode and an n-type contact pad connecting with the n-type electrode through the at least one via accessing the n-type electrode, the contact pads being arranged over the dielectric layer with a minimum contact pads separation between the p-type contact pad and the n-type contact pad that is larger than the minimum electrodes separation between the n-type and p-type electrodes; and
flip-chip bonding the contact pads to printed circuitry of the printed circuit board using bonding bumps arranged on one of the printed circuit board and the chip, the flip-chip bonding having a mechanical tolerance that is greater than the minimum electrodes separation and less than the minimum contact pads separation, there being no sub-mount arranged between the contact pads and the printed circuit board.

17. The method as set forth in claim 16, wherein the disposing of electrical contact pads includes:
depositing a seed layer inside the vias; and
electroplating to fill the vias and to extend electroplated material over the dielectric layer to define the p-type contact pad and the n-type contact pad.

18. The method as set forth in claim 16, wherein:
the disposing of electrical contact pads includes depositing a reflow layer; and
the flip-chip bonding of the contact pads to bonding bumps includes arranging the contact pads in contact with the bonding bumps and applying heat to the reflow layer to effect reflow bonding.

19. The method as set forth in claim 18, wherein the reflow layer includes tin and gold.

20. The method as set forth in claim 16, wherein the disposing of electrical contact pads over the vias and the dielectric layer includes:
filling the vias with a first conductive material;
disposing a second dielectric layer over the first conductive material, the second dielectric layer having vias passing therethrough for accessing the first conductive material; and
disposing the electrical contact pads over the second dielectric layer, the electrical contact pads electrically contacting the n-type and p-type electrodes through the first conductive material and the vias through the second dielectric layer.

21. The method as set forth in claim 20, wherein the disposing of electrical contact pads over the vias and the dielectric layer further includes:
   prior to the disposing of the electrical contact pads, filling the vias through the second dielectric layer with a second conductive material and disposing a third dielectric layer over the second conductive material;
   wherein the third dielectric layer has vias passing therethrough for accessing the second conductive material; and
   wherein the electrical contact pads are disposed over the third dielectric layer and electrically contact the n-type and p-type electrodes through the first conductive material, the second conductive material, and the vias through the third dielectric layer.

22. The method as set forth in claim 16, wherein the light emitting diode further includes a portion of a substrate wafer that is shared with other light emitting diodes fabricated on the substrate wafer, the disposing of a dielectric layer and the disposing of electrical contact pads are performed as wafer-level processes that additionally dispose p-type and n-type electrical contact pads on the other light emitting diodes, and the method further includes:
   after the disposing of the electrical contact pads and prior to the flip chip bonding, dicing the substrate wafer to separate the light emitting diode from the other light emitting diodes.

23. The method as set forth in claim 22, wherein the method further includes:
   after the disposing of the electrical contact pads and prior to the dicing of the substrate wafer, performing at least additional wafer-level process to form at least one optical element on the light emitting diodes.

24. The method as set forth in claim 23, wherein the at least one optical element is selected from a group consisting of an encapsulant, a phosphor layer, and a reflective coating.

25. The method as set forth in claim 23, wherein the disposing a dielectric layer includes:
   disposing the dielectric layer over the substrate wafer to seal front sides of the light emitting diodes including sealing the p-type and n-type electrical contact pads.

26. A method of processing a wafer having a plurality of light emitting diodes fabricated thereon, each light emitting diode having front-side n-type and p-type electrodes defining a minimum electrodes separation between the n-type and p-type electrodes, the method including:
   disposing a dielectric layer over at least the n-type and p-type electrodes, the dielectric layer having vias passing therethrough for accessing the n-type and p-type electrodes;
   disposing electrical contact pads over the vias and the dielectric layer, the electrical contact pads for each light emitting diode including a p-type contact pad that connects with the p-type electrode and an n-type contact pad that connects with the n-type electrode, the connecting being through the vias, the contact pads for each light emitting diode being arranged over the dielectric layer with a minimum contact pads separation between the p-type and n-type contact pads that is larger than the minimum electrodes separation between the n-type and p-type electrodes; and
   after the disposing of the electrical contact pads, dicing the wafer to separate the light emitting diodes.

27. The method as set forth in claim 26, wherein the method further includes:
   subsequent to the disposing of electrical contact pads and prior to the dicing of the wafer, applying at least one optical coating to a backside of the wafer opposite a side of the wafer on which the light emitting diodes are disposed.

28. The method as set forth in claim 26, wherein the dicing of the wafer includes making partial separation cuts through the wafer wherein the light emitting diodes remain secured together by the wafer, and breaking along the partial separation cuts to separate the light emitting diodes, the method further including:
   after making the partial separation cuts and before breaking along the partial separation cuts, applying a metallic coating to surfaces formed by the partial separation cuts.

29. The method as set forth in claim 26, further including: subsequent to the disposing of electrical contact pads and prior to the dicing, securing a front-side of the wafer to tape, the electrical contact pads being disposed on the front-side of the wafer;
   subsequent to the dicing, stretching the tape to define a selected spacing of the separated light emitting diodes; and
   subsequent to the stretching, applying a molding material to the light emitting diodes.

30. A method of flip chip bonding a light emitting diode to a printed circuit board without an interposed sub-mount, the method consisting essentially of the steps of:
   forming one or more fanning layers on the front-side of the light emitting diode, each fanning layer including a dielectric layer and one or more metal layers, the topmost fanning layer defining electrical contact pads in electrical conimunication with front-side n-type and p-type electrodes of the light emitting diode, the electrical contact pads defining a minimum contact pads separation between the electrical contact pads in electrical communication with the n-type and p-type electrodes, respectively, that is larger than a minimum electrodes separation between the front-side n-type and p-type electrodes of the light emitting diode; and
   flip-chip bonding the electrical contact pads to printed circuitry of the printed circuit board without an interposed sub-mount.

31. The method as set forth in claim 30, wherein the one or more fanning layers include at least two fanning layers.

32. The method as set forth in claim 30, wherein the one or more fanning layers seal the front-side n-type and p-type electrodes of the light emitting diode.

* * * * *